United States Patent
Mo et al.

(10) Patent No.: US 7,034,597 B1
(45) Date of Patent: Apr. 25, 2006

(54) DYNAMIC PHASE ALIGNMENT OF A CLOCK AND DATA SIGNAL USING AN ADJUSTABLE CLOCK DELAY LINE

(75) Inventors: Shan Mo, Pocatello, ID (US); James R. Brown, Idaho Falls, ID (US); Richard A. Mosher, Wylie, TX (US); Robert S. Kirk, Mi Wuk Village, CA (US)

(73) Assignee: AMI Semiconductor, Inc., Pocatello, ID (US)

( * ) Notice: Subject to any disclaimer, the term of this patent is extended or adjusted under 35 U.S.C. 154(b) by 50 days.

(21) Appl. No.: 10/933,742

(22) Filed: Sep. 3, 2004

(51) Int. Cl.
*H03H 11/26* (2006.01)

(52) U.S. Cl. ..................... 327/276; 327/277
(58) Field of Classification Search ............... 327/276, 327/277, 278, 283, 284, 141, 149, 153, 158, 327/161; 331/17, 26; 375/375, 376
See application file for complete search history.

(56) References Cited

U.S. PATENT DOCUMENTS

| | | | |
|---|---|---|---|
| 4,756,011 A | 7/1988 | Cordell | 375/118 |
| 4,841,551 A | 6/1989 | Avaneas | 375/118 |
| 5,230,013 A * | 7/1993 | Hanke et al. | 375/373 |
| 5,278,873 A | 1/1994 | Lowrey et al. | 375/118 |
| 5,668,830 A | 9/1997 | Georgiou et al. | 375/220 |

OTHER PUBLICATIONS

Using Source-Synchronous Signaling with DPA in Stratix GX Devices Jan. 2003, ver. 1.1 Application ote 236 Altera Corporation p. 1-18.
The Need for Dynamic Phase Alignment in High-Speed FPGAS White Paper Feb. 2004, ver. 1.1 p. 1-5.

* cited by examiner

*Primary Examiner*—Linh My Nguyen
(74) *Attorney, Agent, or Firm*—Workman Nydegger

(57) ABSTRACT

A dynamic phase adjustment circuit that includes a multi-tap delay line that receives a clock input signal. The multi-tap delay line includes an initial portion that is adjustable, and final portion after the adjustable portion. A number of registers receive the same data. However, the clock signal that causes the registers to sample is received from a corresponding delay element in the final portion of the multi-tap delay line. An edge detect and data decision circuit receives the sampled data values from each of the registers. Sampling resolution is improved over the PLL-based dynamic phase adjustment circuit since the clock signal is delayed using delay elements, which can be made with relatively small delays. Furthermore, the circuit does not contain excessive circuit elements thereby allowing the dynamic phase adjustment circuit to be contained in a small area.

27 Claims, 6 Drawing Sheets

US 7,034,597 B1

DYNAMIC PHASE ALIGNMENT OF A CLOCK AND DATA SIGNAL USING AN ADJUSTABLE CLOCK DELAY LINE

BACKGROUND OF THE INVENTION

1. The Field of the Invention

The present invention relates generally to mechanisms for synchronous data transfer between two circuits. More specifically, the present invention relates to dynamic phase alignment of a clock and data signal using an adjustable clock delay line.

2. Background and Relevant Art

Electronic circuitry has become critical to the functionality of many common devices and systems. In order to accomplish a desired function, it is often desirable for one circuit to communicate with another. The communicating circuits may be on the same chip or even on different chips. Sometimes, the data communicated between the circuits has validity implied from the timing of the data relative to another signal such as a clock. This type of data transfer is often referred to as synchronous data transfer.

In chip-to-chip source synchronous data transfer, a clock signal and a data signal are transmitted from the source circuit. The clock is used in the receiving circuit to time the sampling of the incoming data. At higher transfer rates, it is particularly important that the clock is kept in alignment with the ideal sampling point of the data eye at all times. Accordingly, in the gigabit per second data rate range, dynamic phase alignment is important to compensate the clock and data skew by adaptively keeping the clock and data signals in the desired phase relationship.

At lower data rates, a technique called static phase alignment is often used to set the desired phase relationship. Like static phase alignment, dynamic phase alignment adjusts the data and clock signal phase relationships over variations of process corners, supply voltages and temperatures. Unlike static phase alignment, however, dynamic phase alignment operates adaptively, often at the granularity of a single bit. In other words, the phase alignment is typically compared each time a bit is received, and adjusted if appropriate. The dynamic phase alignment thus allows for more layout flexibility at the package and board level than static phase alignment.

FIG. 6 illustrates a conventional PLL-based dynamic phase adjustment circuit 600. Referring to FIG. 6, the input clock signal 602 goes into a Phase Locked Loop (PLL) 611, which generates multiple phases of the clock. In the illustrated case, there are eight clock signals generated that are spaced in increments of 45 degrees. Accordingly, the clock signals include clock signals CK0, CK45, CK90, CK135, CK180, CK225, CK270 and CK315. The clock signals of the different phases then allow the registers 612 to sample the input data signal 601 at slightly different times evenly spread through a clock cycle. The outputs of the registers 612 go to the edge detect and data decision block 613. The edge detect and data decision block 613 identifies the data edge and selects a correct data sample that is within the data window defined by the data edge.

In FIG. 6, the data sample is picked from the eight register outputs driven by evenly spaced phases of the clock. More phases would provide better accuracy for the sampling to be closer to the ideal sampling point that is close to the middle of the data window. In other words, FIG. 6 describes an over-sampling approach which has better sampling resolution with more phases available. However, it is difficult to generate more than eight phases using a PLL. Consequently, the sampling resolution of the PLL-based dynamic phase adjustment circuit 600 of FIG. 6 is limited. Furthermore, a PLL is usually located at a fixed place on the chip. If the input data and the input clock do not happen to be in close vicinity, globally routed clocks from the PLL will more likely lose their evenly spaced phase relationship.

FIG. 7 illustrates another conventional dynamic phase alignment circuit 700. Referring to FIG. 7, the input data 701 goes into a multi-tap delay line 711 to generate multiple delayed replicas of the data input. The delayed data replicas are then fed to registers 712. A single clock signal 702 is used by each of the registers 712 to sample the delayed replicas of the data. The outputs of the registers 712 then go to the edge detect and data decision block 713. Once again, the edge detect and data decision block 713 identifies the data edge and selects a correct data sample that is within the data window defined by the data edge.

The multi-tap delay line dynamic phase adjustment circuit 700 of FIG. 7 may provide better sampling resolution than the PLL-based dynamic phase adjustment circuit 600 of FIG. 6. The improved sampling resolution may be achieved in FIG. 7 by using delay elements that have small propagation delay. However, since the data and clock signal phase relation is unknown, the input data is delayed for at least one clock period to exhaust all possible phase states. Furthermore, fine resolution of each delay element means large number of data replicas in one clock period. In a typical source synchronous application such as SPI-4.2 where one clock is sent along with 16 data bits, 16 delay lines are needed. As a result, the total number of delay elements and the associated flip-flops could force the dynamic phase alignment circuit to be quite large and thus impractical.

Accordingly, what would be advantageous is a dynamic phase alignment circuit that may have better sampling resolution without being inordinately large and complex.

BRIEF SUMMARY OF THE INVENTION

The foregoing problems with the prior state of the art are overcome by the principles of the present invention which are directed towards a new dynamic phase adjustment circuit. A multi-tap delay line receives a clock input signal. The multi-tap delay line includes an initial portion that is adjustable, and final portion after the adjustable portion. A number of registers receive the same data. However, the clock signal that causes the registers to sample is received from a corresponding delay element in the final portion of the multi-tap delay line. An edge detect and data decision circuit receives the sampled data values from each of the registers.

Sampling resolution is improved over the PLL-based dynamic phase adjustment circuit since the clock signal is delayed using delay elements, which can be made with relatively small delays. Furthermore, the circuit does not contain many circuit elements thereby allowing the dynamic phase adjustment circuit to be contained in a small area. This reduces the risk that the phase relationship between the various delayed clock signals will be lost.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention relate to a dynamic phase adjustment circuit. Dynamic phase adjustment circuits serve to keep the phase of the clock and data signals synchronized during source synchronous data transfer so that the data may be properly sampled and interpreted at the receiving side. The dynamic phase adjustment circuit can significantly improve the sampling resolution as compared to the PLL-based dynamic phase adjustment circuit described above, while being potentially far less complex than the multi-tap delay line dynamic phase adjustment circuit also described above.

Figure 1:
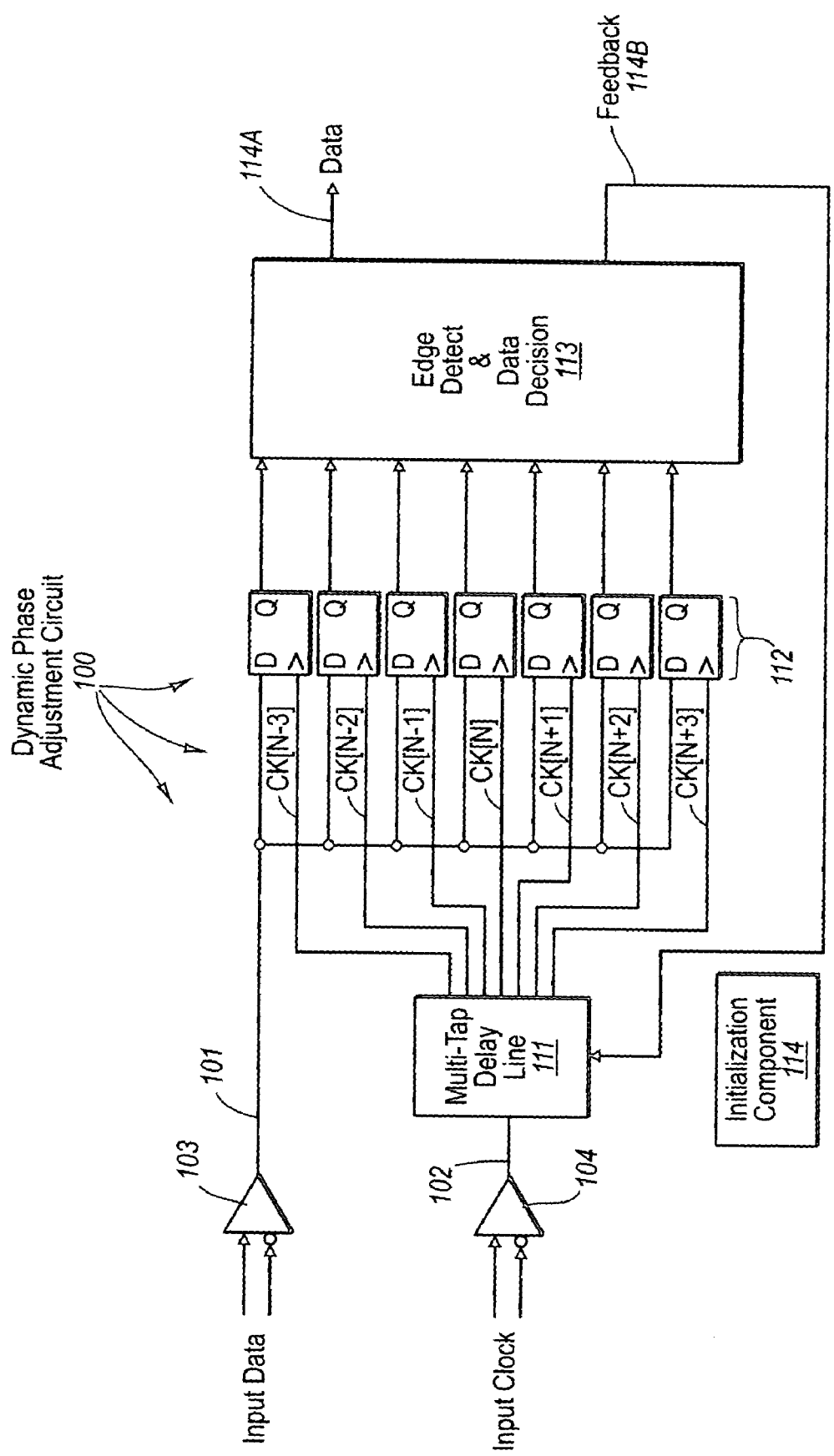
FIG. 1 illustrates dynamic phase adjustment circuit in accordance with the principles of the present invention.

FIG. 1 illustrates a dynamic phase adjustment circuit 100 in accordance with the principles of the present invention. The dynamic phase adjustment circuit 100 includes a data input terminal 101 for receiving input data during operation, and a clock input terminal 102 for receiving clock signals during operation. When the data signal is transmitted in differential form, a differential data receiver 103 may be used to convert the data signal from differential form to single-ended form. When the clock signal is transmitted in differential form, a differential clock receiver 104 may be used to convert the clock signal from differential form to single-ended form.

The clock signal from the clock input terminal 102 is fed to a multi-tap delay line 111. The multi-tap delay line 111 uses the clock signal to generate multiple clock signals having various delays. In the illustrated example of FIG. 1, the multi-tap delay line 111 generates seven delayed clock signals CK[N−3], CK[N−2], CK[N−1], CK[N], CK[N+1], CK[N+2] and CK[N+3].

The dynamic phase adjustment circuit 100 also includes a number of registers 112, each have a data input terminal (designated by "D"), a clock input terminal, and an output terminal (designated by "Q"). The registers 112 are each configured to sample the data signal on its data input terminal at a time designated by the clock signal on the clock input terminal, and provide a signal representing the sampled value on its output terminal. Such registers are known to those of ordinary skill in the art. An edge detect and data decision circuit 113 is configured to receive the sampled data values from the registers 112. The edge detect and data decision circuit 113 then extracts the data by, for example, selecting one of the sampled data values for further processing. The data is then provided on output 114A.

In contrast to the conventional PLL-based dynamic phase adjustment circuit 600, the dynamic phase adjustment circuit 100 in accordance with the present invention uses a multi-tap delay line to generate the clock phases rather than a PLL. Also, in contrast to the conventional multi-tap delay line dynamic phase adjustment circuit 700, the dynamic phase adjustment circuit 100 does not delay the input data in order to generate data replicas.

Figure 2:
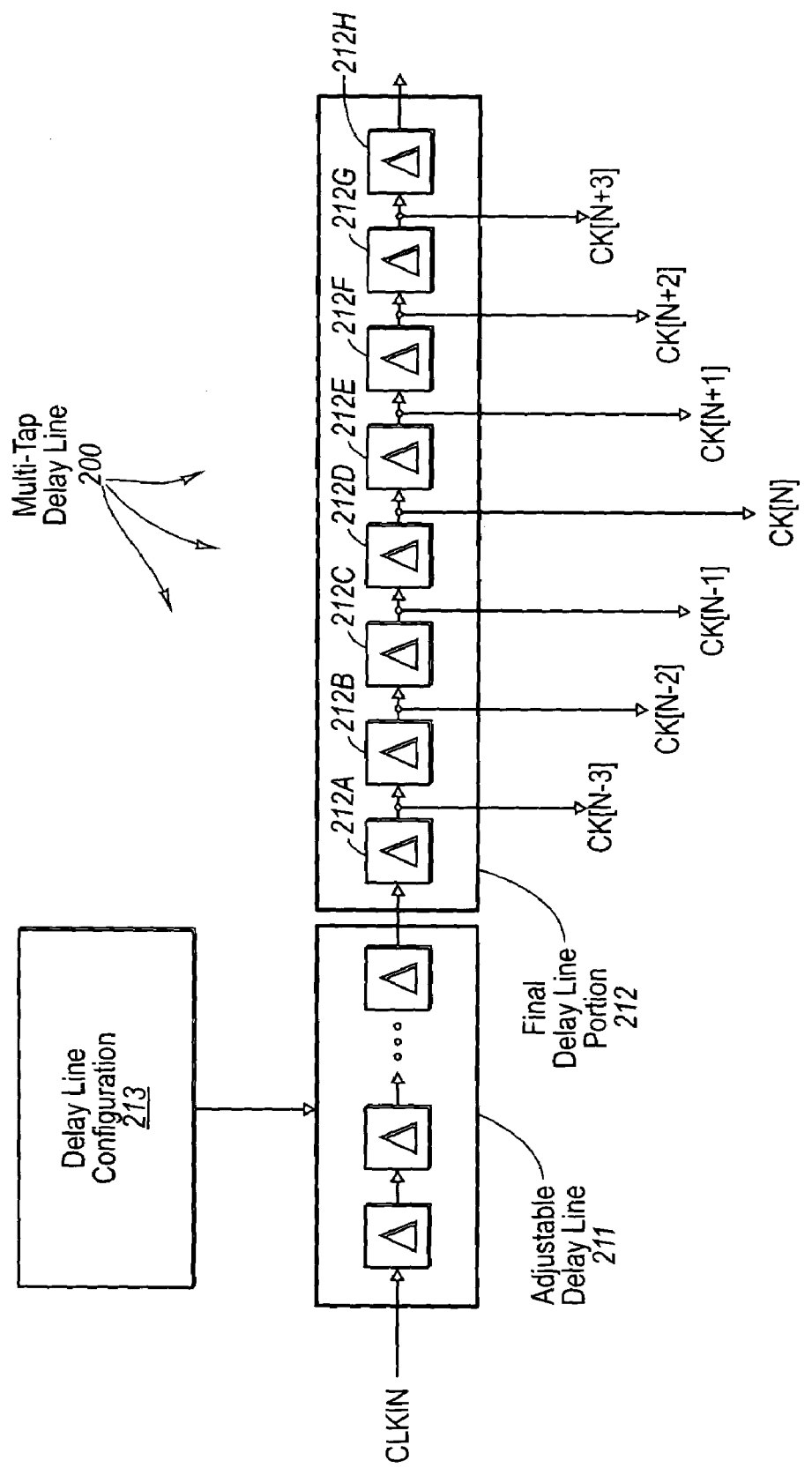
FIG. 2 illustrates an example of the multi-tap delay line of FIG. 1 in further detail.

FIG. 2 illustrates an example 200 of the multi-tap delay line 111 of FIG. 1. The multi-tap delay line 200 includes a series of delay elements. These delay elements may preferably introduce substantially similar propagation delays, although the principles of the present invention will also work if the propagation delays are substantially different. Since the propagation delays are preferably substantially the same, the principles of the present invention will be described assuming that this is the case.

The clock signal is first fed through an initial portion of the multi-tap delay line 200 labeled as "adjustable" delay line 211. The clock signal then passes through a final delay line portion 212. The initial adjustable delay line 211 is configured to apply an adjustable delay to any clock signal received by the clock input terminal. In the illustrated example of FIG. 2, this is accomplished using a delay line configuration module 213, which adjusts the number of delay elements through which the clock signal passes in the initial adjustable delay line 211. The delay line configuration module 213 may be as simple as a binary counter and decoder, although additional logic such as a phase detector may be embedded therein as desired.

The final delay line portion 212 also includes a number of delay elements. The delayed clock signals CK[N−3], CK[N−2], CK[N−1], CK[N], CK[N+1], CK[N+2] and CK[N+3] are obtained by tapping the clock signal from the respective output terminals of the first through seventh delay elements 212A through 212G of the final delay line portion 212. The final delay line portion 212 also includes an eighth delay element 212H, which exists only to provide the same load to the seventh delay element 212G as is present for the other active delay elements 212A through 212F.

Each delay element, when properly designed, can have a small delay that translates to a very fine phase increment. For example, suppose that a clock frequency is 500 MHz, a 50 ps propagation delay of a delay element is $1/40^{th}$ the 500 MHz clock period. Therefore, there is the equivalent of 40 evenly-spaced phases available for the 500 MHz clock compared to the 8 phases a PLL often provides. This represents a five-fold improvement in sampling and phase resolution as compared to the PLL-based dynamic phase adjustment circuit 600.

Furthermore, a PLL is normally large and cannot be replicated throughout the chip without sacrificing significant chip area. Accordingly, the PLL is often inflexible in location on the chip. Furthermore, a PLL is sensitive to noise since it is an analog circuit. In contrast, a multi-tap delay line is small and can be laid out right next to the input data and input clock buffers. As a result, no global clock routing is required and the phase relationship among clocks is much easier to maintain.

In addition, one problem in the conventional multi-tap delay line dynamic phase adjustment circuit 700 is making edge detection and data decision based on the large number of delayed and sampled replicas. Too much logic complicates the implementation, potentially even slowing the timing and preventing the circuit from reaching the desired data rate.

The dynamic phase adjustment circuit 100 of FIG. 1 potentially simplifies the approach in two ways. First, it delays the clock rather than delaying the data. In typical source synchronous applications where one input clock accompanies multiple input data, the number of delay lines and the associated logic is minimized. Second, the circuit 100 employs a unique structure in which the adjustable delay line creates a moving window (described below with respect to FIG. 3) to select a limited number of clock phases in sampling the data. While controlling the moving window takes some logic, the overall implementation is simplified because the number of the sampling registers is significantly reduced, along with reduced complexity in the logic need to implement the edge detect and data decision block. Furthermore, the adjustable delay line could be updated at a speed lower than the data rate, further favoring the tradeoff.

Figure 4:
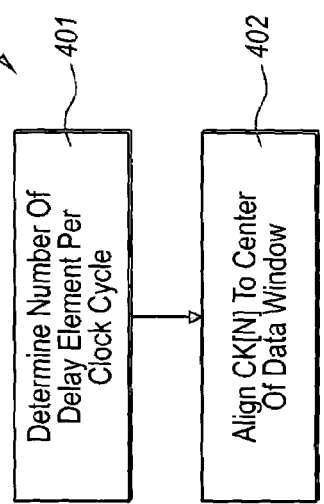
FIG. 4 illustrates a flowchart of a method for initializing the dynamic phase adjustment circuit of FIG. 1.
Figure 5:
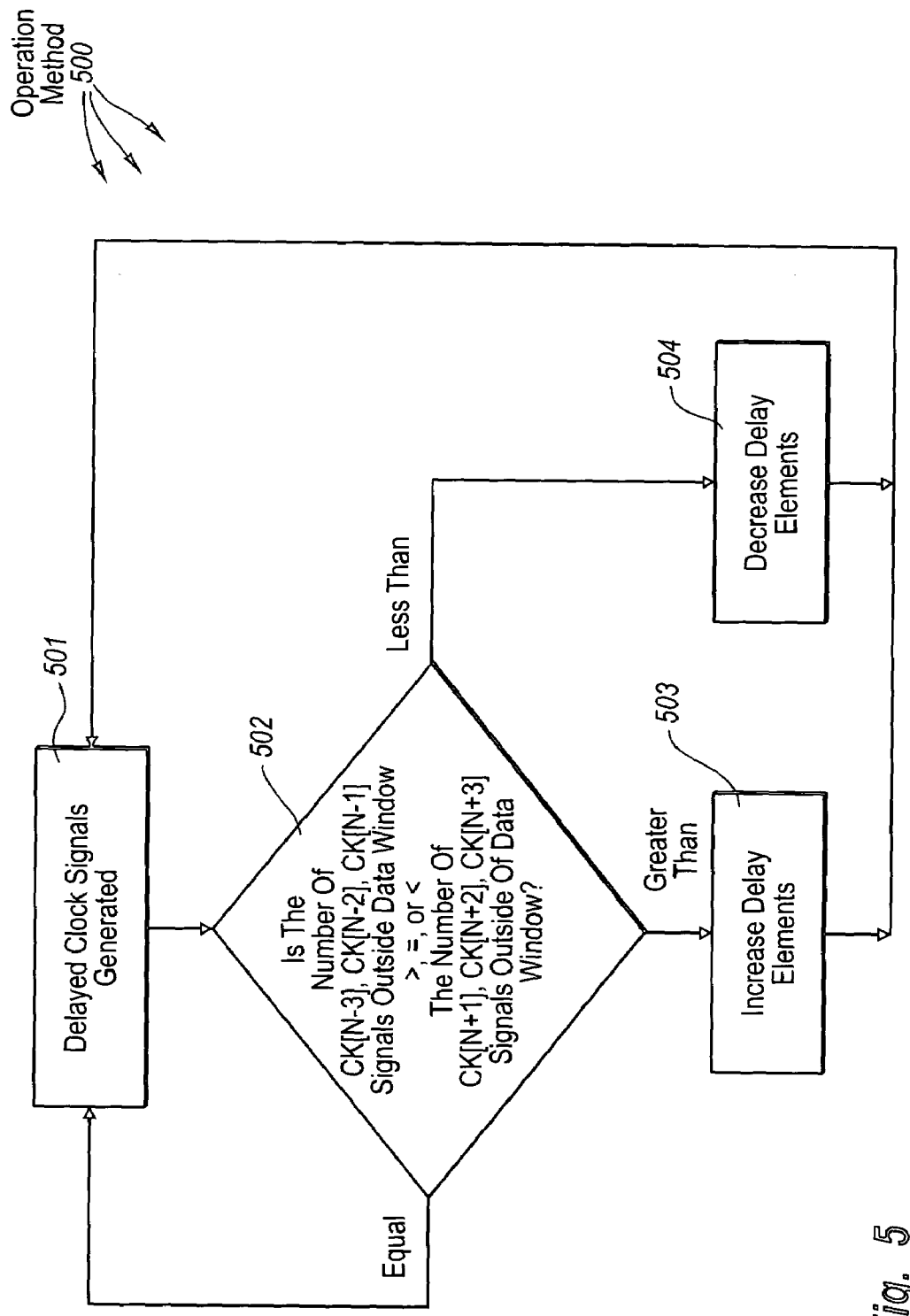
FIG. 5 illustrates a flowchart of a method for operating the dynamic phase adjustment circuit of FIG. 1 after initialization.
Figure 6:
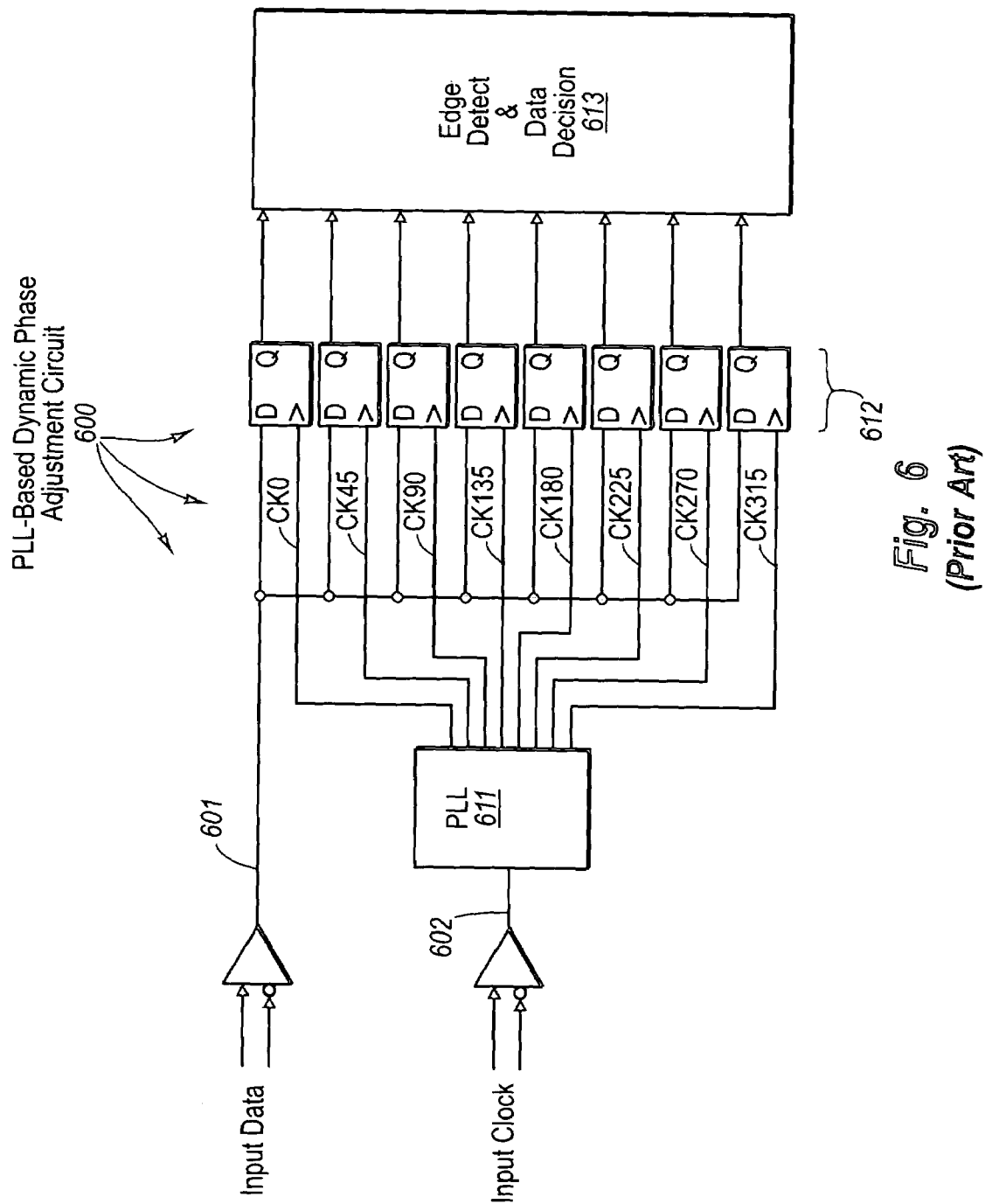
FIG. 6 illustrates a PLL-based dynamic phase adjustment circuit in accordance with the prior art.
Figure 7:
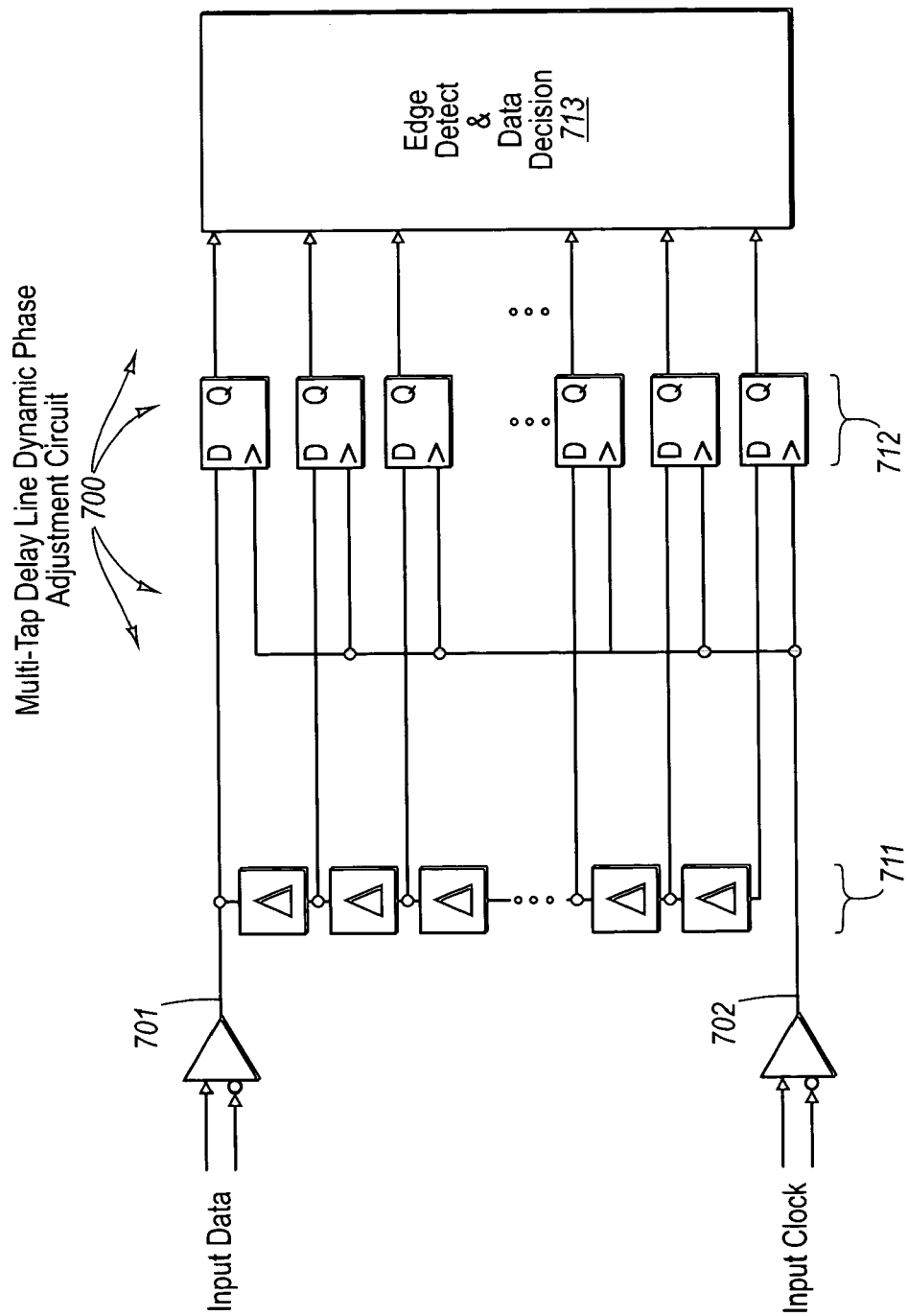
FIG. 7 illustrates a multi-tap delay line dynamic phase adjustment circuit in accordance with the prior art.

The specific operation of the dynamic phase adjustment circuit 100 will now be described with respect to the signal diagram of FIG. 3, and the flowcharts of FIGS. 4 and 5. FIG. 4 illustrates a flowchart of a method 400 for initializing the dynamic phase adjustment circuit 100. FIG. 5 illustrates a flowchart of a method 500 for operating the dynamic phase adjustment circuit 100 after initialization.

During initialization, the adjustable delay line is trained with the input clock. This determines the number of delay elements per clock cycle (act 401). During training, an initialization component 114 progressively increments the number of delay elements in the adjustable delay line 111 one at a time in a linear fashion. Other search strategies are possible including binary search, multi-step search, and the like. The delayed clock is compared against the input clock. When they are edge aligned, the final number of delay elements (L) that gives one clock period delay is registered. In the example of a 500 MHz clock signal in which each delay element introduces 50 picoseconds of propagation delay, the number of delay elements in a clock period (L) is 40.

In addition, the adjustable delay line is trained while some known data sequences are sent to the input data buffer. This is to align the clock edge of the central delayed clock signal CK[N] to the center of the data window mid-point between data edges (act 402). During training, the number of delay elements in the adjustable delay line 211 progressively decrements by one at a time. When the data edge is detected between CK[N] and CK[N+1], the number of delay elements (M) in the adjustable delay line 111 is registered. The number of delay elements in the adjustable delay line is then adjusted to be M-L/2 modulo L, or M-L/4 modulo L if there is double data rate transfer in which both clock edges triggered data transition. At this point, the clock edge of CK[N] should now be at the center of the data eye opening.

Figure 3:
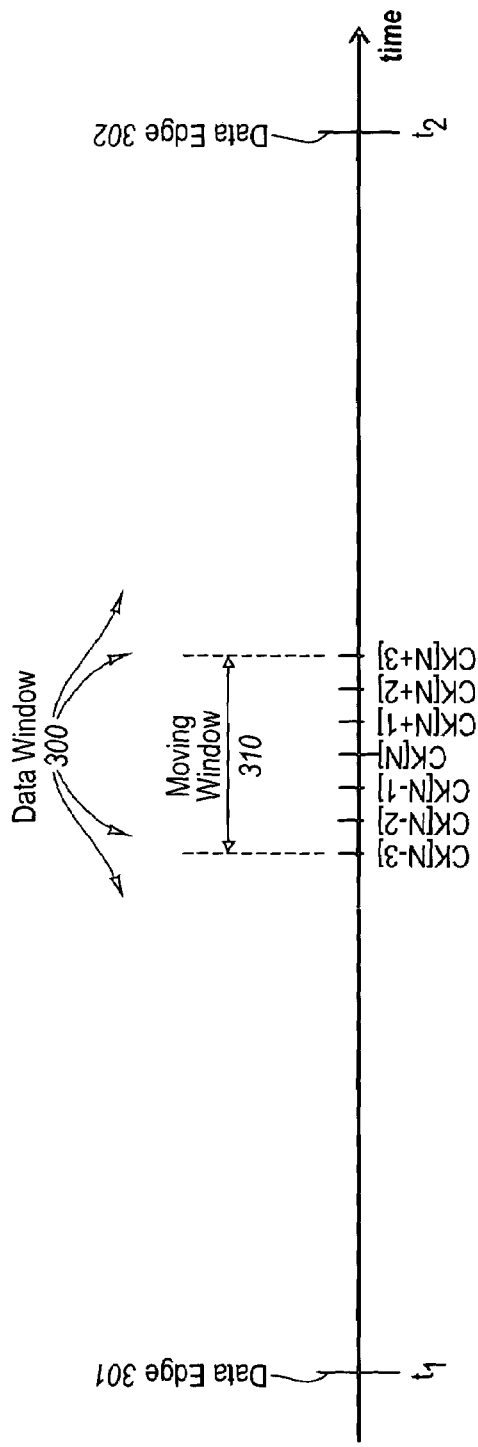
FIG. 3 illustrates a data window in relation to a moving window defined by the triggering times of the various delayed clock signals that are fed to the registers.

In FIG. 3, the span of an entire data window 300 is shown as it might exist immediately after initialization. The data window begins at time t1 when the data edge 301 is received by the registers 112. The data window ends at time t2 when the data edge 302 for the next bit of data is received by the registers 113. The initialization described above with respect to FIG. 4 results in the rising edge of the clock signal CK[N] being received in the middle of the data window 300. This results in the register receiving the clock signal CK[N] to sample the data signal in the middle of the data window 300, which is likely the optimal sampling point since the data signal is least noisy in the middle of the data eye.

The data signal is also sampled at the rising edges of clocks CK[N−3], CK[N−2], CK[N−1], CK[N+1], CK[N+2] and CK[N+3]. FIG. 3 also shows these sampling times. The range of times between when the signal CK[N−3] transitions and when the signal CK[N+3] transitions is represented in FIG. 3 by moving window 310. As long as the entire moving window stays within the appropriate data edges 301 and 302, all of the registers 112 should be sampling the same data bit.

Over time, however, the center point of the moving window (represented by the rising edge of CK[N]) could drift because of process, voltage and temperature variations. Hence, the moving window 310 may shift to the left or right. FIG. 5 illustrates a flowchart of a method 500 for keeping the clock and data signal synchronized such that the center point of the moving window 310 stays within the appropriate data edges 301 and 302.

Upon generating the delayed clock signals CK[N−3], CK[N−2], CK[N−1], CK[N], CK[N+1], CK[N+2] and CK[N+3] (act 501), the edge detect and data decision circuit 113 determines whether the number of clock signals CK[N−3], CK[N−2] and CK[N−1] that fall outside of the data window is greater than, equal to, or less than the number of clock signals CK[N+1], CK[N+2] and CK[N+3] that fall outside of the data window (decision block 502). The remainder of the method may be performed for each clock cycle. However, in cases in which drift tends to occur fairly slowly, the method may not be performed every clock cycle. In one embodiment, the edge detect and data decision circuit 113 is configurable to perform the method of FIG. 5 every one or more clock cycles as desired. Alternatively or in addition, to combat sporadic noise, acts 503 and 504 may defer any change until the same decision by decision block 502 occurs multiple times in a row.

If there is an equal number of clock signals on each side of clock signal CK[N] that fall outside of the data window ("Equal" in decision block 502), then this means that none of the clock signals fall outside of the data window if the moving window 310 is smaller than the data window 300. Alternatively, if the moving window 310 is wider than the data window 300, this means that the rising edge of the clock signal CK[N] is still within the data window 300 and likely close to the center of the data window. In either case, no action is taken in this case since synchronization has been realized.

If there is a greater number of clock signals on the left side of clock signal CK[N] that fall outside of the data window than on the right hand side of the clock signal CK[N], then the moving window is beginning to cross the boundary of the data edge 301 if the moving window 310 is smaller than the data window 300. Alternatively, if the moving window 310 is wider than the data window 300, this means that the moving window is drifting leftwards so that it extends more beyond the left data edge 301 than the right data edge 302. In this case ("Greater Than" in decision block 502), the number of delay elements in the adjustable delay line 211 is increased by one (act 503). This may be accomplished using the feedback line 114B of FIG. 1. This should cause the moving window 310 to shift to the right, or at least shift more slowly to the left.

If there is a greater number of clock signals on the right side of clock signal CK[N] that fall outside of the data window than on the left hand side of the clock signal CK[N], then the moving window is beginning to cross the boundary of the data edge 302 if the moving window 310 is smaller than the data window 300. Alternatively, if the moving window 310 is wider than the data window 300, this means that the moving window is drifting rightwards so that it extends more beyond the right data edge 302 than the left data edge 301. In this case ("Less Than" in decision block 502), the number of delay elements in the adjustable delay line 211 is decreased by one (act 504). This may also be accomplished using the feedback line 114B of FIG. 1. This should cause the moving window 310 to shift to the left, or at least shift more slowly to the right.

This process is continued until there is no data edge found within the moving window if the moving window 310 is smaller than the data window 300, or until the moving window is once again centered in the data window if the moving window 310 is broader than the data window 300.

In one embodiment, the edge detect and data decision circuit 113 is configured to detect when the clock signals fall outside of the data window, and take appropriate corrective action to reorient the moving window within the data window as described herein.

Having described the principles of the present invention with respect to a specific example, those of ordinary skill in the art will recognize (after having reviewed this description) that the example circuit described with respect to FIGS. 1 through 5 is illustrative only. The types of circuits that may be designed to employ the principles of the present invention are enumerable. An attempt to describe each of such circuits would obscure the more general principles of the present invention. Nevertheless, the principles of the present invention include various modifications and variations on the principles described herein.

For example, the number of active delay elements in the final delay line portion may be other than seven. For example, there may be any number of such delay elements such as three, five, nine or more, or any other number of delay elements. In fact, it may be desirable to adjust the width of the moving window 310 to close to the width of the data window to thereby reduce jitter and limit the movement of the moving window 311. In general, the size of the moving window should be at least twice the size of the anticipated combined cycle-to-cycle clock and data jitter although the present invention is not limited to this by any means. In one embodiment, the number of delay elements in the final delay portion may be configurable as appropriate given the size of the data window. The size of the data window may be determined during initialization. The number of delay elements in the final delay line portion may then be configured based on the data window size. In addition, the delay introduced by each delay element need not be the same. For example, delay elements closer the delay element generating delayed clock signal CK[N] may have shorter delay, wherein more distant delay elements may have longer delay, depending on the desires of the circuit designer.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A dynamic phase adjustment circuit comprising the following:
    a clock input terminal for receiving a clock signal during operation;
    a multi-tap delay line comprising an initial adjustable delay line and a final delay line portion, wherein the initial adjustable delay line is configured to apply an adjustable delay to any clock signal received by the clock input terminal, and wherein the final delay line portion includes a plurality of delay elements;
    a plurality of registers, each having a data input terminal and a clock input terminal, wherein each register is configured to sample a signal at its data input terminal according to timing represented by a signal on the register's the clock input terminal, wherein each of clock input terminals of the plurality of registers is coupled to an output terminal of a corresponding delay element of the plurality of delay elements in the final delay line portion; and
    a delay line configuration module configured to adjust the delay applied by the initial adjustable delay line.

2. A dynamic phase adjustment circuit in accordance with claim 1, further comprising the following:
    an edge detect and data decision circuit configured to receive the sampled data values from the plurality of registers.

3. A dynamic phase adjustment circuit in accordance with claim 2, wherein the edge detect and data decision circuit is further configured to select one of the sample data values for further processing.

4. A dynamic phase adjustment circuit in accordance with claim 2, wherein the edge detect and data decision circuit is configured to detect when one or more of the latest sampled values falls outside of a time window.

5. A dynamic phase adjustment circuit in accordance with claim 4, wherein the delay line configuration module is configured to decrease the delay applied by the initial adjustable delay line when one or more of the latest sampled values falls outside of the time window.

6. A dynamic phase adjustment circuit in accordance with claim 5, wherein the edge detect and data decision circuit is configured to detect when one or more of the earliest sampled values falls outside of the time window.

7. A dynamic phase adjustment circuit in accordance with claim 6, wherein the delay line configuration module is configured to increase the delay applied by the initial adjustable delay line when one or more of the earliest sampled values falls outside of the time window.

8. A dynamic phase adjustment circuit in accordance with claim 2, wherein the edge detect and data decision circuit is configured to detect when one or more of the earliest sampled values falls outside of a time window.

9. A dynamic phase adjustment circuit in accordance with claim 8, wherein the delay line configuration module is configured to increase the delay applied by the initial adjustable delay line when one or more of the earliest sampled values falls outside of the time window.

10. A dynamic phase adjustment circuit in accordance with claim 1, further comprising an initialization circuit configured to cause the plurality of registers to begin sampling data within a data window.

11. A dynamic phase adjustment circuit in accordance with claim 10, wherein the initialization circuit is configured to cause the plurality of registers to begin sampling within the data window by performing the following:
   an act of registering a first number (L) of delay elements that gives one clock period of delay;
   an act of aligning a clock edge of a central delayed clock signal to the center of the data window mid-point between data edges; and
   an act of registering a second number (M) of delay elements required to perform the act of aligning.

12. A dynamic phase adjustment circuit in accordance with claim 11, where the initialization circuit is further configured to cause the plurality of registers to begin sampling within the data window by performing the following
   an act of adjusting a number of delay elements in the initial adjustable delay line to be M-L/2 modulo L.

13. A dynamic phase adjustment circuit in accordance with claim 11, where the initialization circuit is further configured to cause the plurality of registers to begin sampling within the data window by performing the following
   an act of adjusting a number of delay elements in the initial adjustable delay line to be the quantity of M-L/4 modulo L.

14. A dynamic phase adjustment circuit in accordance with claim 1, wherein the initial adjustable delay line comprises a plurality of delay elements.

15. A dynamic phase adjustment circuit in accordance with claim 1, wherein the plurality of delay elements in the final delay line portion are of approximately equal delay.

16. A dynamic phase adjustment circuit in accordance with claim 1, wherein the plurality of delay elements in the final delay line portion are of different delay.

17. A dynamic phase adjustment circuit in accordance with claim 1, wherein the plurality of delay elements in the final delay line portion is three or greater.

18. A dynamic phase adjustment circuit in accordance with claim 1, wherein the plurality of delay elements in the final delay line portion is five or greater.

19. A dynamic phase adjustment circuit in accordance with claim 1, wherein the plurality of delay elements in the final delay line portion is seven or greater.

20. A dynamic phase adjustment circuit in accordance with claim 1, wherein the plurality of delay elements in the final delay line portion is nine or greater.

21. A dynamic phase adjustment circuit in accordance with claim 1, wherein the number of delay element in the plurality of delay elements in the final delay line portion is configurable.

22. A method for operating a dynamic phase adjustment circuit, wherein the includes a clock input terminal for receiving a clock signal during operation, a multi-tap delay line comprising an initial adjustable delay line and a final delay line portion wherein the initial adjustable delay line is configured to apply an adjustable delay to any clock signal received by the clock input terminal and wherein the final delay line portion includes a plurality of delay elements, a plurality of registers having a data input terminal and a clock input terminal wherein each register is configured to sample a signal at its data input terminal according to timing represented by a signal on the register's clock input terminal wherein each of clock input terminals of the plurality of registers is coupled to an output terminal of a corresponding delay element of the plurality of delay elements in the final delay line portion, a delay line configuration module configured to adjust the delay applied by the initial adjustable delay line, and an edge detect and data decision circuit configured to receive the sampled data values from the plurality of registers, the method for operating the dynamic phase adjustment circuit comprising the following:
   during one clock cycle, an act of determining that there are sampled data values that fall outside of a data window appropriate for the clock cycle;
   an act of adjusting the adjustable delay applied by the initial adjustable delay line as appropriate so that in subsequent clock cycles, the sampled data values are all within the appropriate data window for the clock cycle corresponding to the sampled data values; and
   during a subsequent clock cycle, an act of determining that there are no sampled data values that fall outside of a data window appropriate for the subsequent clock cycle.

23. A method in accordance with claim 22,
   wherein the act of determining that there are sampled data values that fall outside of a data window appropriate for the clock cycle comprises an act of determining that one or more earlier sampled data values fall outside of the data window appropriate for the clock cycle, and
   wherein the act of adjusting the adjustable delay applied by the initial adjustable delay line comprises an act of increasing the number of delay element through which the clock signal passes in the initial adjustable delay line.

24. A method in accordance with claim 22,
   wherein the act of determining that there are sampled data values that fall outside of a data window appropriate for the clock cycle comprises an act of determining that one or more later sampled data values fall outside of the data window appropriate for the clock cycle, and
   wherein the act of adjusting the adjustable delay applied by the initial adjustable delay line comprises an act of decreasing the number of delay element through which the clock signal passes in the initial adjustable delay line.

25. A method for operating a dynamic phase adjustment circuit, wherein the includes a clock input terminal for receiving a clock signal during operation, a multi-tap delay line comprising an initial adjustable delay line and a final delay line portion wherein the initial adjustable delay line is configured to apply an adjustable delay to any clock signal received by the clock input terminal and wherein the final delay line portion includes a plurality of delay elements, a plurality of registers having a data input terminal and a clock input terminal wherein each register is configured to sample a signal at its data input terminal according to timing represented by a signal on the register's clock input terminal wherein each of clock input terminals of the plurality of registers is coupled to an output terminal of a corresponding delay element of the plurality of delay elements in the final delay line portion, a delay line configuration module configured to adjust the delay applied by the initial adjustable delay line, and an edge detect and data decision circuit configured to receive the sampled data values from the plurality of registers, a method for operating the dynamic phase adjustment circuit comprising the following:
   during one clock cycle, an act of determining that there are sampled data values that fall outside of a data window appropriate for the clock cycle, where more sampled data values fall outside of the data window on a first side of the data window than on a second side of the data window; and an act of adjusting the adjustable delay applied by the initial adjustable delay line as appropriate so that in subsequent clock cycles, there are fewer sampled data values that fall outside of the data window on the first side of the data window.

26. A method in accordance with claim 25, wherein the first side of the data window is earlier than the second side of the data window.

27. A method in accordance with claim 25, wherein the first side of the data window is later than the second side of the data window.

* * * * *

UNITED STATES PATENT AND TRADEMARK OFFICE
CERTIFICATE OF CORRECTION

PATENT NO. : 7,034,597 B1 Page 1 of 1
APPLICATION NO. : 10/933742
DATED : April 25, 2006
INVENTOR(S) : Mo et al.

It is certified that error appears in the above-identified patent and that said Letters Patent is hereby corrected as shown below:

Column 6
Line 3, change "113" to --112--

Column 7
Line 52, change "311" to --310--

Column 8
Line 25, after "register's" remove "the"
Line 26, before "clock" insert --the--
Column 9
Line 55, after "wherein the" insert --dynamic phase adjustment circuit--

Column 10
Lines 6-7, remove "for operating the dynamic phase adjustment circuit"
Line 45, after "wherein the" insert --dynamic phase adjustment circuit--
Lines 63-64, remove "for operating the dynamic phase adjustment circuit"

Signed and Sealed this

Fourteenth Day of November, 2006

JON W. DUDAS
*Director of the United States Patent and Trademark Office*